United States Patent
Lee et al.

(10) Patent No.: US 9,263,590 B2
(45) Date of Patent: Feb. 16, 2016

(54) THIN FILM TRANSISTOR AND MANUFACTURING METHOD THEREOF

(71) Applicant: SAMSUNG DISPLAY CO., LTD., Yongin, Gyeonggi-Do (KR)

(72) Inventors: Jung-Kyu Lee, Gyeonggi-Do (KR);
Do-Hyun Kwon, Gyeonggi-Do (KR);
Min-Jung Lee, Gyeonggi-Do (KR);
Sung-Eun Lee, Gyeonggi-Do (KR);
Moo-Soon Ko, Gyeonggi-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/558,937

(22) Filed: Dec. 3, 2014

(65) Prior Publication Data
US 2015/0155391 A1 Jun. 4, 2015

(30) Foreign Application Priority Data
Dec. 4, 2013 (KR) .................. 10-2013-0149726

(51) Int. Cl.
*H01L 29/786* (2006.01)
*H01L 29/66* (2006.01)
*H01L 29/10* (2006.01)

(52) U.S. Cl.
CPC ...... *H01L 29/78675* (2013.01); *H01L 29/1033* (2013.01); *H01L 29/66757* (2013.01)

(58) Field of Classification Search
CPC ................. H01L 29/78675; H01L 29/1033; H01L 29/66757
See application file for complete search history.

(56) References Cited

U.S. PATENT DOCUMENTS

| 5,767,530 | A  | * | 6/1998  | Ha .............................. 257/72 |
| 6,636,280 | B1 | * | 10/2003 | Miyazawa et al. ............. 349/43 |
| 7,642,574 | B2 |   | 1/2010  | Bulucea |
| 2002/0137235 | A1 | * | 9/2002 | Rohlfing ..................... 438/11 |
| 2004/0038600 | A1 | * | 2/2004 | Miyazawa et al. ........... 439/894 |
| 2005/0074914 | A1 | * | 4/2005 | Chang et al. .................. 438/48 |
| 2006/0071352 | A1 | * | 4/2006 | Glasse et al. ................ 257/900 |
| 2010/0006854 | A1 | * | 1/2010 | Ono et al. ..................... 257/72 |
| 2011/0133277 | A1 |   | 6/2011 | Cha et al. |
| 2013/0168760 | A1 |   | 7/2013 | Hsieh |
| 2014/0084385 | A1 | * | 3/2014 | Hoffmann et al. ........... 257/402 |

FOREIGN PATENT DOCUMENTS

| KR | 1020100084642 | 7/2010 |
| KR | 1020110063161 | 6/2011 |
| KR | 1020110133622 | 12/2011 |

* cited by examiner

*Primary Examiner* — Allan R Wilson
(74) *Attorney, Agent, or Firm* — F. Chau & Associates, LLC

(57) ABSTRACT

A thin film transistor (TFT) includes a semiconductor active layer, a gate electrode, a source electrode, and a drain electrode. The semiconductor active layer includes a first doped region as a source region, a second doped region as a drain region, an undoped region between the first and second doped regions. A third doped region is disposed between the second doped region and the undoped region. The gate electrode is insulated from the semiconductor active layer and overlaps the third doped region and the undoped region. The source electrode and the drain electrode are connected to the first and second doped regions.

18 Claims, 6 Drawing Sheets

THIN FILM TRANSISTOR AND MANUFACTURING METHOD THEREOF

CROSS-REFERENCE TO RELATED APPLICATION

This application claims priority under 35 U.S.C. §119 to Korean Patent Application No. 10-2013-0149726, filed on Dec. 4, 2013, in the Korean Intellectual Property Office, the disclosure of which is incorporated by reference herein in its entirety.

1. TECHNICAL FIELD

Exemplary embodiments of the present invention relate to a thin film transistor, and more particularly to a thin film transistor and a manufacturing method thereof.

2. DISCUSSION OF RELATED ART

Recently, polycrystalline silicon thin film transistors (TFT) have been developed as a switching element or a driving element of display devices. The polycrystalline silicon thin film transistors may be manufactured at a temperature similar to that of an amorphous silicon TFT by using a crystallization technology using a laser. The polycrystalline silicon TFT may have high mobility of electrons and holes, relative to the amorphous silicon TFT, and may be used in a complementary metal-oxide semiconductor (CMOS) having an n channel or a p channel. The polycrystalline silicon TFT may be used as a driving circuit element and pixel driving element on a large insulating substrate.

In manufacturing the polycrystalline silicon TFT, a silicon crystal may be damaged during a doping process. The damaged silicon crystal need not be completely recovered even in a follow-up activation process.

When electrons are accelerated from a source region to a drain region, a hot carrier stress may be generated as electrons flow into a gate insulating layer or a MOS interface from a damaged silicon crystal, and electron mobility may be reduced. Hot carrier stress may reduce stability of a circuit operation when a display device is driven. An OFF current of a TFT may be increased due to hot carrier stress.

SUMMARY

Exemplary embodiments of the present invention relate to a thin film transistor (TFT) capable of preventing leakage of an OFF current.

An exemplary embodiment of the present invention relates to a method for manufacturing the TFT.

A thin film transistor (TFT) according to an exemplary embodiment of the present invention includes a semiconductor active layer, a gate electrode, a source electrode, and a drain electrode. The semiconductor active layer may include a first doped region as a source region, a second doped region as a drain region, an undoped region between the first and second doped regions, and a third doped region between the second doped region and the undoped region. The gate electrode may be insulated from the semiconductor active layer and overlap with the third doped region and the undoped region. The source electrode may be connected to the first doped region. The drain electrode may be connected to the second doped region.

The third doped region may include a first portion doped with an impurity and a second portion disposed on the first portion. The second portion may be undoped.

The semiconductor active layer may include a first polycrystalline silicon layer; and a second polycrystalline silicon layer disposed on the first polycrystalline silicon layer. The first portion may be disposed in the first polycrystalline silicon layer and the second portion may be disposed in the second polycrystalline silicon layer.

A thickness of the first polycrystalline silicon layer may be greater than or equal to 0.5 times a thickness of the semiconductor active layer and less than or equal to 1 time the thickness of the semiconductor active layer.

Doping concentration of the third region may be greater than or equal to 0.5 times a doping concentration of the first and second doped regions and is less than or equal to 5 times a doping concentration of the first and second doped regions.

A method for manufacturing a thin film transistor (TFT) according to an exemplary embodiment of the present invention includes forming a first polycrystalline silicon layer on a base substrate. A first doping process is performed to form first and second impurity regions in opposite ends of the first polycrystalline silicon layer. A second polycrystalline silicon layer is formed on the first polycrystalline silicon layer to form a semiconductor active layer including the first and second polycrystalline silicon layers. A gate electrode is formed overlapping with a region between the first and second impurity regions, and partially overlapping with one of the first and second impurity regions. The gate electrode is insulated from the semiconductor active layer. A second doping process is performed using the gate electrode as a mask to form first and second doped regions in opposite ends of the semiconductor active layer not overlapping with the gate electrode, an undoped region between the first and second doped region, and a third doped region between the second doped region and the undoped region. A source electrode is formed in the first doped region. A drain electrode connected to the first doped region is formed.

The third doped region may include a first portion of the first polycrystalline silicon layer, which does not overlap with the gate electrode. A second portion may be disposed on the first region. The second portion may be undoped.

A doping concentration of the first region may be greater than or equal to 0.5 times a doping concentration of the first and second doped regions and less than or equal to 1 time a doping concentration of the first and second doped regions. A thickness of the first polycrystalline silicon layer may be greater than or equal to 0.5 times a thickness of the semiconductor active layer and less than or equal to 1 time a thickness of the semiconductor active layer.

A method for manufacturing a thin film transistor (TFT) according to an exemplary embodiment of the present invention includes forming a first polycrystalline silicon layer on a base substrate. A first doping process may be performed to form an impurity region in the first polycrystalline silicon layer. A second polycrystalline silicon layer may be formed on the first polycrystalline silicon layer to form a semiconductor active layer including the first and second polycrystalline silicon layers. A gate electrode overlapping the semiconductor active layer including a portion of the impurity region may be formed. The gate electrode may be insulated from the semiconductor active layer. A second doping process may be performed using the gate electrode as a mask to form first and second doped regions in opposite ends of the semiconductor active layer not overlapping with the gate electrode, an undoped region between the first and second doped region, and a third doped region disposed between the second doped region and the undoped region and including the impurity region. A source electrode connected to the first doped region may be formed. A drain electrode connected to the second doped region may be formed.

The third doped region may include a first portion including the impurity region of the first polycrystalline silicon layer. The third doped region may include a second portion which is disposed on the first region and is undoped.

A doping concentration of the first region may be greater than or equal to 1 time a doping concentration of the first and second doped regions and less than or equal to 5 times a doping concentration of the first and second doped regions. A thickness of the first polycrystalline silicon layer may be greater than or equal to 0.5 times a thickness of the semiconductor active layer and less than or equal to 1 time a thickness of the semiconductor active layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
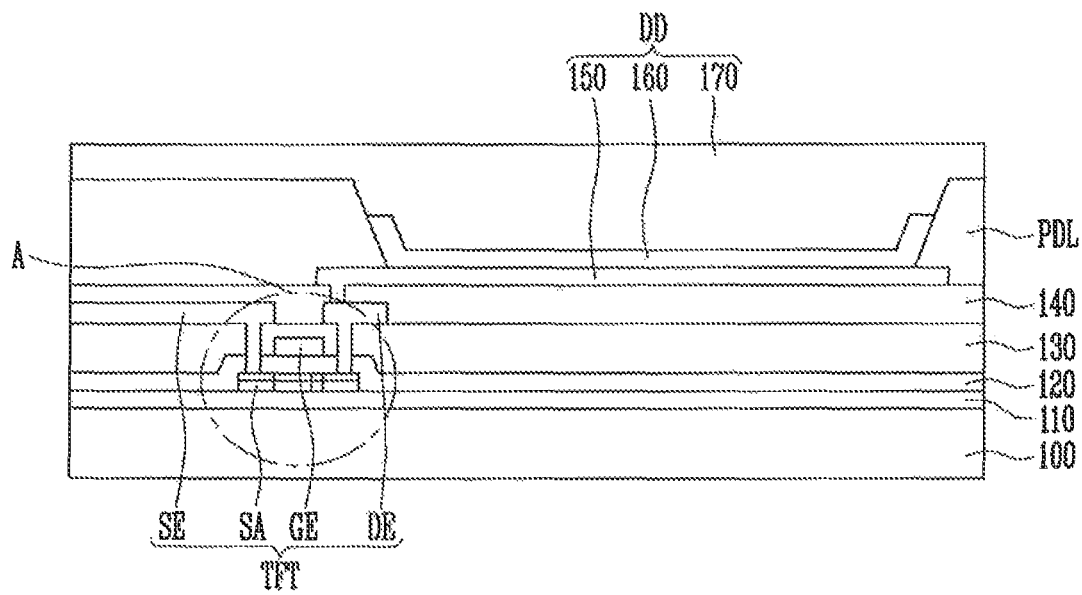
FIG. 1 is a cross-sectional view illustrating a display device including a thin film transistor (TFT) according to an exemplary embodiment of the present invention.

The present invention may be modified in various ways and may have various embodiments, particular examples of which may be illustrated in the drawings and described in more detail below. However, it is to be understood that the present invention is not limited to specific exemplary embodiments described, but includes all modifications, equivalents, and substitutions without departing from the scope and spirit of the present invention.

In the accompanying drawings, like numbers may refer to like elements. In the accompanying drawings, dimensions of structures may be exaggerated to clarify exemplary embodiments of the present invention. While terms such as "first" and "second," etc., may be used to describe various components, such components should not be understood as being limited to the above terms. The above terms may be used to distinguish one component from another. For example, a first component may be referred to as a second component or a second component may be referred to as a first component without departing from the spirit and scope of the present invention.

It will be understood that when an element such as a layer, film, region, or substrate is referred to as being "on" another element, it can be directly on the other element or intervening elements may be present. It will be understood that when an element such as a layer, film, region, or substrate is referred to as being "beneath" another element, it can be directly on the other element or intervening elements may be present.

Hereinafter, exemplary embodiments of the present invention will be described in detail with reference to the accompanying drawings.

Figure 2:
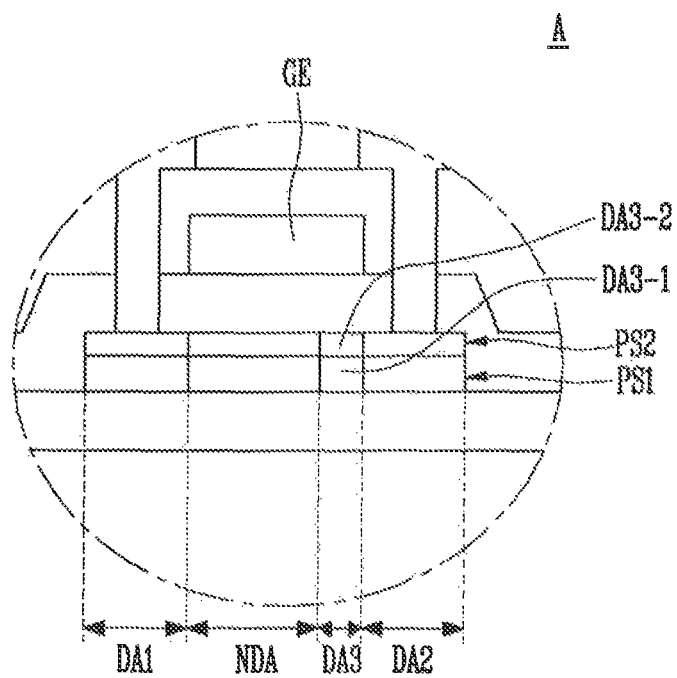
FIG. 2 is an enlarged view of a region 'A' in FIG. 1.

FIG. 1 is a cross-sectional view illustrating a display device including a thin film transistor (TFT) according to an exemplary embodiment of the present invention, and FIG. 2 is an enlarged view of a region 'A' in FIG. 1. A direction in which a switching TFT and a display device are disposed in a base substrate according to exemplary embodiments of the present invention may be referred to herein as an upper part, and an organic light emitting device may be discussed as an exemplary display device.

Referring to FIGS. 1 and 2, the display device may include a base substrate 100, a TFT disposed on the base substrate 100, and a display element DD.

The base substrate 100 may include a transparent insulating material that allows light to be transmitted therethrough. The base substrate 100 may be a rigid type base substrate or a flexible type base substrate. The rigid type base substrate may be a glass base substrate, a quartz base substrate, a glass ceramic base substrate, or a crystalline glass base substrate. The flexible type base substrate may be a film base substrate including a polymer organic substance or a plastic base substrate. A material having resistance (e.g., heat resistance) to a high processing temperature during a manufacturing process may be included in the base substrate 100.

The TFT may include a semiconductor active layer SA disposed on the base substrate 100, a gate electrode GE overlapping the semiconductor active layer SA, and a source electrode SE and a drain electrode DE insulated from the gate electrode GE and connected to the semiconductor active layer SA.

The semiconductor active layer SA may include a first polycrystalline silicon layer PS1 and a second polycrystalline silicon layer PS2. A thickness of the first polycrystalline silicon layer PS1 may be equal to or greater than 0.5 times to less than one time as thick as the semiconductor active layer SA. The semiconductor active layer SA may include first and second doped regions DA1 and DA2 disposed at opposite ends of the semiconductor active layer SA. The first and second doped regions DA1 and DA2 may be doped with an impurity, for example, a P-type impurity. An undoped region NDA may be interposed between the first and second doped regions DA1 and DA2, and a third doped region DA3 may be interposed between the second doped region DA2 and the undoped region NDA. The undoped region NDA may be a channel region of the TFT.

The first and second doped regions DA1 and DA2 may be a source region and a drain region of the TFT, respectively. Doping concentration of the first and second doped regions DA1 and DA2 may be substantially the same.

The third doped region DA3 may include a first region DA3-1 disposed on a buffer layer 110 and doped with an impurity and a second region DA3-2 disposed on the first region DA3-1 and not doped. The first region DA3-1 may be disposed in the first polycrystalline silicon layer PS1, and the second region DA3-2 may be disposed in the second polycrystalline layer PS2. A height of the first region DA3-1 may be equal to or greater than 0.5 times to less than 1 time as thick as the semiconductor active layer SA. A doping concentration of the third doped region DA3 may be in a range from about 0.5 times to about 5 times the doping concentration of the first and second doped regions DA1 and DA2. When power is applied to the TFT, electrons may be accelerated from the first doped region DA1 to the second doped region DA2, and the third doped region DA3 may prevent leakage of a current when power of the TFT is cut off.

The buffer layer 110 may be disposed between the base substrate 100 and the semiconductor active layer SA. The buffer layer 110 may be an insulating layer including a silicon oxide film and/or a silicon nitride film. For example, the buffer layer 110 may have a dual-layer structure including the silicon oxide film disposed on the base substrate 100 and the silicon nitride film disposed on the silicon oxide film. The buffer layer 110 may prevent impurities effused within the base substrate 100 from spreading to the semiconductor active layer SA, for example, to the undoped region NDA, during a manufacturing process of the TFT. The buffer layer 110 may planarize a surface of the base substrate 100.

A gate insulating layer 120 may be disposed on the semiconductor active layer SA and the base substrate 100. The gate insulating layer 120 may insulate the semiconductor active layer SA and the gate electrode GE. The gate insulating layer 120 may include a silicon oxide film and/or a silicon nitride film.

The gate electrode GE may be disposed on the gate insulating layer 120, and may be configured to overlap with the semiconductor active layer SA. For example, the gate electrode GE may be configured to overlap with the undoped region NDA and the third doped region DA3. The gate electrode GE may include a conductive material.

An interlayer insulating layer 130 may be disposed on the gate electrode GE. The interlayer insulating layer 130 may include a silicon oxide film and/or a silicon nitride film. The interlayer insulating layer 130 may include contact holes exposing portions of the first doped region DA1 and the second doped region DA2 of the semiconductor active layer SA.

The source electrode SE and the drain electrode DE may be disposed on the interlayer insulating layer 130. The source electrode SE may be connected to the first doped region DA1 via the contact hole exposing the first doped region DA1, and the drain electrode DE may be connected to the second doped region DA2 via the contact hole exposing the second doped region DA2. The source electrode SE and the drain electrode DE may include copper (Cu), a copper alloy, aluminum (Al), and/or an aluminum alloy.

A protective layer 140 may be disposed on the base substrate 100 with the TFT disposed thereon. The protective layer 140 may cover the TFT. The protective layer 140 may include a via hole exposing a portion of the drain electrode DE.

The protective layer 140 may include at least one layer. For example, the protective layer 140 may include an inorganic protective layer and an organic protective layer disposed on the inorganic protective layer. The inorganic protective layer may include a silicon oxide and/or a silicon nitride. The organic protective layer may include one of acryl, polyimide (PI), polyamide (PA), or benzocyclobutene (BCB). The organic protective layer may be a planarization layer that may be flexible and may lessen a curve of a lower structure.

The display element DD may be disposed on the protective layer 140. The display element DD may be an organic light emitting element. The display element DD may include a first electrode 150 connected to the drain electrode DE, an organic layer 160 disposed on the first electrode 150, and a second electrode 170 disposed on the organic layer 160.

At least one of the first electrode 150 and the second electrode 170 may be a transmissive electrode. For example, when the display device is a bottom emission-type organic light emitting display device, the first electrode may be a transmissive electrode and the second electrode 170 may be a reflective electrode. For example, when the display device is a top emission-type organic light emitting display device, the first electrode may be a reflective electrode and the second electrode 170 may be a transmissive electrode. For example, when the display device is a dual emission-type organic light emitting display device, both the first electrode 150 and the second electrode 170 may be transmissive electrodes.

One of the first electrode 150 and the second electrode 170 may be an anode electrode, and the other may be a cathode electrode.

According to an exemplary embodiment of the present invention described in more detail below, the first electrode 150 may be a transparent anode and the second electrode 170 may be a reflective cathode electrode.

The first electrode 150 may be disposed on the protective layer 140 and may be connected to the drain electrode DE through the via hole. The first electrode 150 may include a transparent conductive oxide having a high work function, relative to the second electrode 170. For example, the first electrode 150 may include one of indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (PTO).

A portion of the first electrode 150 may be exposed by an opening in a pixel defining layer PDL. The pixel defining layer PDL may include an organic insulating material. For example, the pixel defining layer PDL may include polystylen, polymethylmethacrylate (PMMA), polyacrylonitrile (PAN), polyamide, polyimide, polyarylether, heterocyclic polymer, parylene, fluorinated polymer, an epoxy resin, a benzocyclobutene series resin, a siloxane series resin, and/or a silane resin.

The second electrode 170 may include a material having a small work function, relative to the first electrode 150. For example, the second electrode 170 may include Mo, W, Ag, Mg, Al, Pt, Pd, Au, Ni, Nd, Ir, Cr, Li, and/or Ca, and/or an alloy thereof.

The organic layer 160 may be disposed on the first electrode 150 exposed by the pixel defining layer PDL. The organic layer 160 may include one or more emission layers, and the organic layer 160 may have a multilayer structure. For example, the organic layer 160 may include a hole injection layer HIL that injects holes, a hole transport layer HTL that has a high degree of hole mobility and blocks a movement of electrons which have failed to be combined in the emission layer to increase hole-electron recombination chances, the emission layer that emits light according to a recombination of injected holes and electrons, a hole blocking layer HBL that blocks a movement of holes which have failed to be combined in the emission layer, an electron transport layer ETL which transports electrons to the emission layer, and an electron injection layer EIL which injects electrons. A color of light generated in the emission layer of the organic layer 160 may be red, green, blue, or white, but the present disclosure is not limited thereto. For example, a color of light generated in the emission layer may be magenta, cyan, or yellow.

Figure 3:
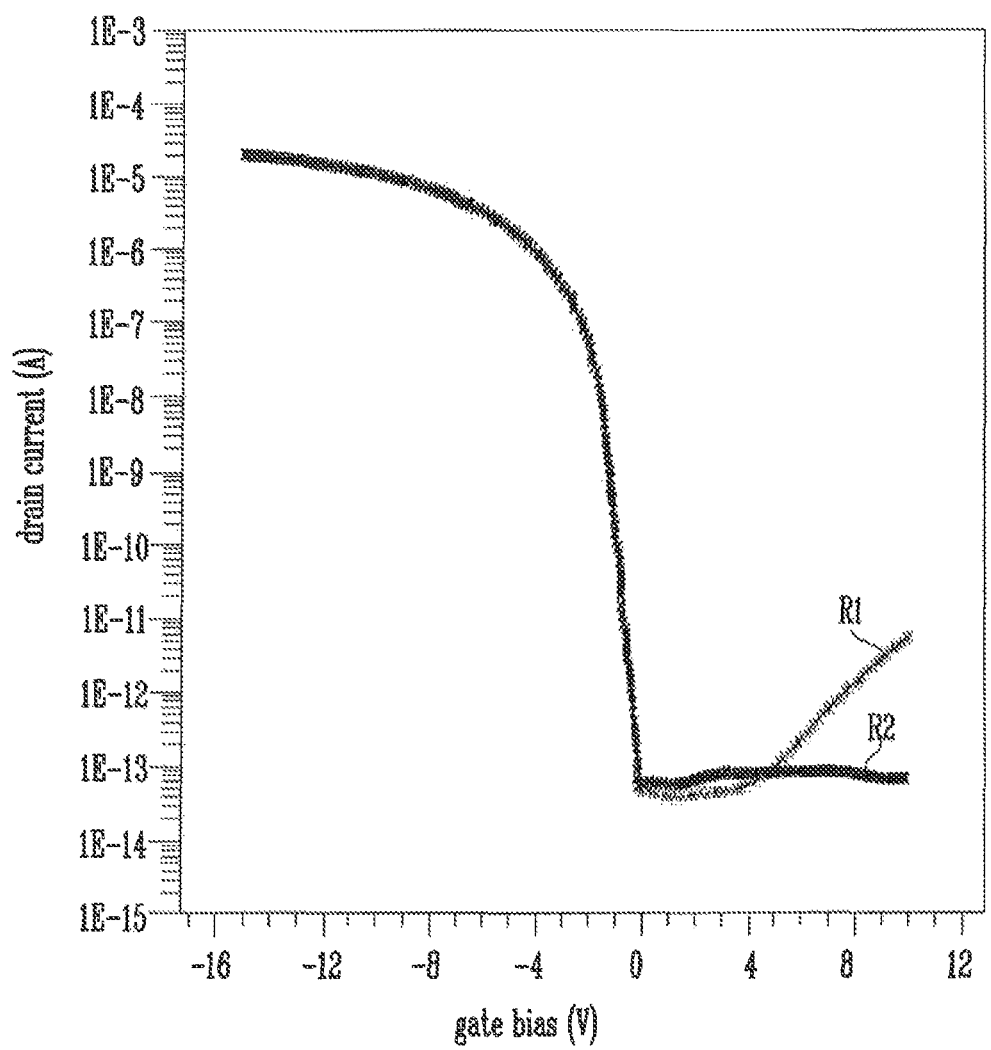
FIG. 3 is a graph showing a change in a drain current over a gate voltage.

FIG. 3 is a graph showing a change in a drain current over a gate voltage. R1 indicate a comparative example in which a doped region of a semiconductor layer does not overlap with a gate electrode, and R2 is an experimental example in which a portion of a doped region of a semiconductor active layer overlaps with a gate electrode.

Referring to FIG. 3, the TFT R1 in which a doped region of a semiconductor active layer does not overlap with a gate electrode, when power is turned off, a current is leaked according to a strength of a voltage applied to a gate.

However, in the TFT R2 in which a portion of the doped region of the semiconductor active layer overlaps with a gate electrode, it can be seen that when power is turned off, a current is not leaked according to a strength of an applied voltage. The display device having the TFT in which a portion of the doped region of the semiconductor active layer overlaps with the gate electrode may have increased driving stability.

FIGS. 4 through 8 are cross-sectional views illustrating a method for manufacturing the TFT illustrated in FIG. 1.

Figure 4:
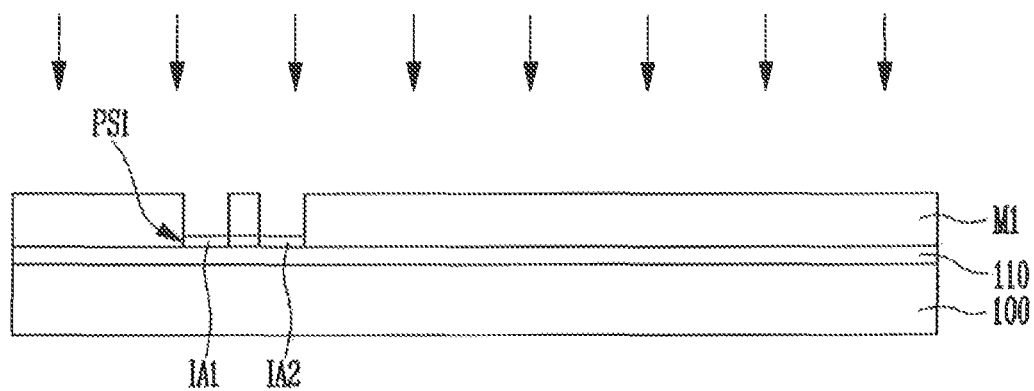
FIGS. 4 through 8 are cross-sectional views illustrating a method for manufacturing the TFT illustrated in FIG. 1.

Referring to FIG. 4, the buffer layer 110 may be formed on the base substrate 100. The buffer layer 110 may be an insulating layer including a silicon oxide film and/or a silicon nitride film. For example, the buffer layer 110 may have multiple layers including one or more silicon oxide films and one or more silicon nitride films. The buffer layer 110 may planarize a surface of the base substrate 100.

After forming the buffer layer 110, the first polycrystalline silicon layer PS1 may be formed on the buffer layer 110. A first mask layer M1 may expose both ends of the first polycrystalline silicon layer PS1. The first mask layer M1 may include a photoresist material. For example, the first mask layer M1 may apply the photoresist material to the buffer layer 110 with the first polycrystalline silicon layer PS1 disposed thereon and performing an exposing, a curing, and developing process thereon.

After the first mask layer M1 is formed, a first doping process may be performed to dope impurity, for example, a P-type impurity, in both ends of the first polycrystalline silicon layer PS1. Opposite ends of the first polycrystalline silicon layer PS1 may be first and second impurity regions IA1 and IA2 doped with an impurity having a first doping concentration.

Figure 5:
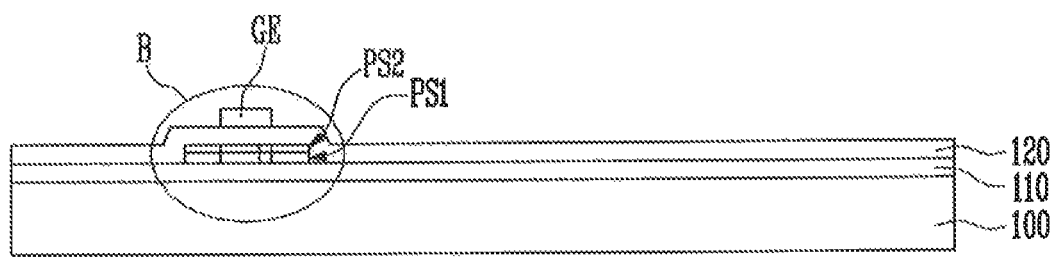

Referring to FIG. 5, after the first doping process is performed, a second polycrystalline silicon layer PS2 may be formed on the first polycrystalline silicon layer PS1 to form a semiconductor active layer SA including the first polycrystalline silicon layer PS1 and the second polycrystalline silicon layer PS2. A thickness of the first polycrystalline silicon layer PS1 may be equal or greater than 0.5 times to less than 1 time as thick as the semiconductor active layer SA.

After the semiconductor active layer SA is formed, the gate insulating layer 120 covering the buffer layer 110 and the semiconductor active layer SA may be formed. The gate insulating layer 120 may include a silicon oxide film and/or a silicon nitride film.

After the gate insulating layer 120 is formed, a conductive material may be applied to the gate insulating layer 120 and patterned to form the gate electrode GE. The gate electrode GE may overlap with the undoped region NDA and a portion of the second impurity region IA2 of the first polycrystalline silicon layer PS1.

After the gate electrode GE is formed, a second doping process may be performed with a P-type impurity by using the gate electrode GE as a mask. The second doping process may be performed such that the P-type impurity is doped up to the first polycrystalline silicon layer PS1.

Figure 6:
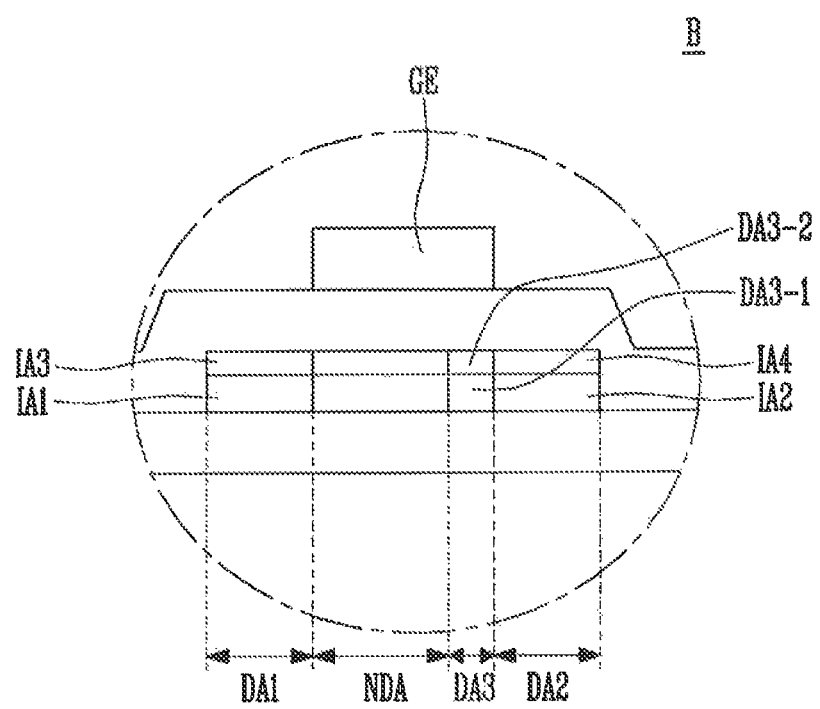

As illustrated in FIG. 6, through the second doping process, opposite ends of the polycrystalline silicon layer PS2 may be third and fourth impurity regions IA3 and IA4 doped with an impurity having a second doping concentration. The second doping concentration may be one to two times as concentrated as the first doping concentration.

Doping concentration of regions overlapping with the third and fourth impurity regions IA3 and IA4 in the first polycrystalline silicon layer PS1 may be substantially the same as that of the third and fourth impurity regions IA3 and IA4.

The first and third impurity regions IA1 and IA3 may be the first doped region DA1. The second impurity region IA2 overlapping with the fourth impurity region IA4 may be the second doped region DA2. The first and second doped regions DA1 and DA2 may be source and drain regions of the TFT.

The first region DA3-1 of the semiconductor active layer SA overlapping with the gate electrode GE and a second region DA3-2 of the second polycrystalline silicon layer PS2 corresponding to the first region DA3-1 may be the third doped region DA3. When the first region DA3-1 is not doped with an impurity in the second doping process, it may have a doping concentration different from that of either of the first and second doped regions DA1 and DA2.

A region between the first and third doped regions DA1 and DA3 may be a channel region of the TFT.

Figure 7:
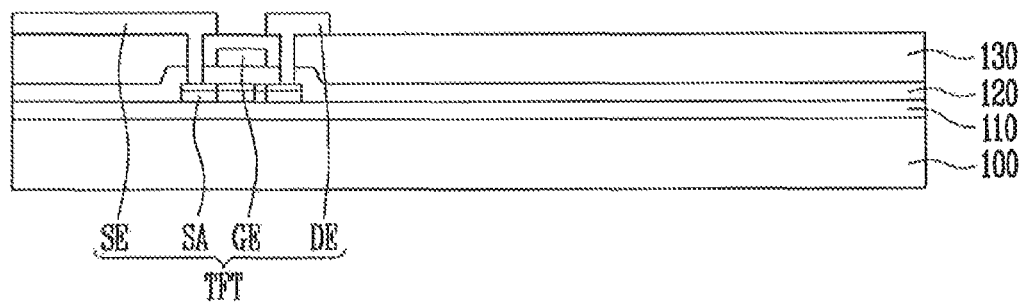

Referring to FIG. 7, after the second doping process is performed, the interlayer insulating layer 130 covering the gate electrode GE may be formed. The interlayer insulating layer 130 may include a silicon oxide film and/or a silicon nitride film.

The interlayer insulating layer 130 may be patterned to form contact holes exposing portions of the first and second doped regions DA1 and DA2.

After the contact holes are formed, a conductive material may be applied to the interlayer insulating layer 130 to form a conductive material film. The conductive material film may include a copper film, a copper alloy film, an aluminum film, and/or an aluminum alloy film.

The conductive material film may be patterned to form the source electrode SE and the drain electrode DE connected to the first and second doped regions DA1 and DA2, respectively, thus manufacturing the TFT.

Figure 8:
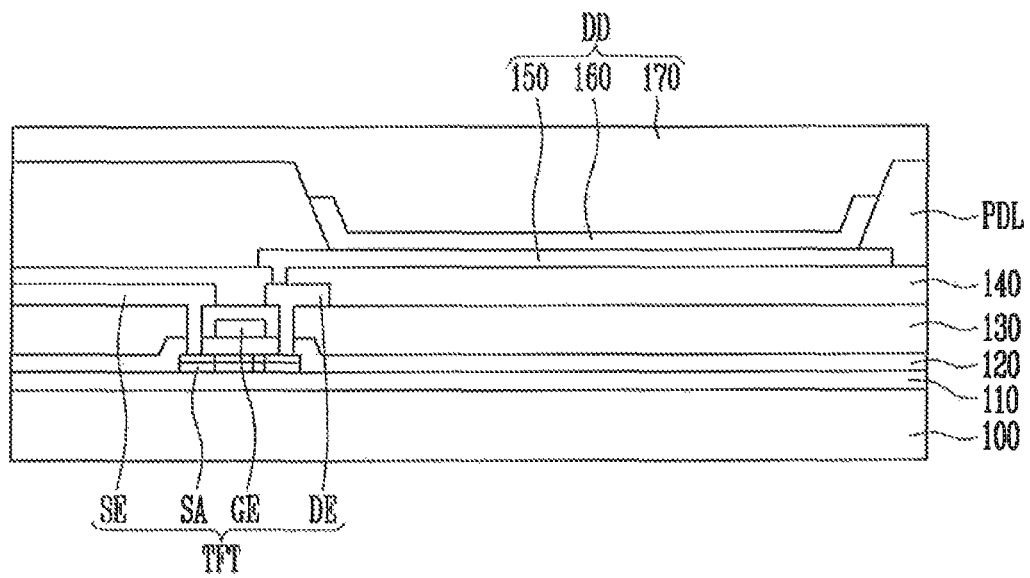

Referring to FIG. 8, after the TFT is formed, the protective layer 140 covering the TFT may be formed. The protective layer 140 may include one or more layers. For example, the protective layer 140 may include an inorganic protective layer and an organic protective layer disposed on the inorganic protective layer. The inorganic protective layer may include a silicon oxide and/or a silicon nitride. The organic protective layer may include one of acryl, polyimide (PI), polyamide (PA), or benzocyclobutene (BCB). The organic protective layer may be a planarization layer that may have flexibility to lessen a curve of a lower structure.

After the protective layer 140 is formed, the protective layer 140 may be patterned to form a via hole exposing a portion of the drain electrode DE.

After the via hole is formed, the display element DD including the first electrode 150 disposed on the protective layer 140 and connected to the drain electrode DE, the organic layer 160 disposed on the first electrode 150, and the second electrode 170 disposed on the organic layer 160 may be formed. A method for forming the display element DD will be described in more detail below.

The first electrode 150 may be formed on the protective layer 140. The first electrode 150 may include a transparent conductive oxide having a high work function, relative to the second electrode 170. For example, the first electrode 150 may include one of indium tin oxide (ITO), indium zinc oxide (IZO), aluminum zinc oxide (AZO), gallium doped zinc oxide (GZO), zinc tin oxide (ZTO), gallium tin oxide (GTO), or fluorine doped tin oxide (FTO).

After the first electrode 150 is formed, the pixel defining layer PDL exposing a portion of the first electrode may be formed.

After the pixel defining layer PDL is formed, the organic layer 160 may be formed on the first electrode 150. The organic layer 160 may be formed through a depositing method, a transferring method, and/or a printing method. The organic layer 160 may include at least one emission layer, and may have a multilayer structure. For example, the organic layer 160 may include a hole injection layer HIL that injects holes, a hole transport layer HTL that has hole transportation and blocks a movement of electrons which have failed to be combined in the emission layer to increase hole-electron recombination chances, the emission layer that emits light according to recombination of injected holes and electrons, a hole blocking layer HBL that blocks a movement of holes which have failed to be combined in the emission layer, an electron transport layer ETL which transports electrons to the emission layer, and an electron injection layer EIL which injects electrons.

After the organic layer 160 is formed, the second electrode 170 may be formed on the organic layer 160 to manufacture the display element DD. The second electrode 170 may include a material having a small work function, relative to the first electrode 150. For example, the second electrode 170 may include Mo, W, Ag, Mg, Al, Pt, Pd, Au, Ni, Nd, Ir, Cr, Li, Ca, and/or an alloy thereof.

After the second electrode 170 is formed, a display device may be manufactured through a general encapsulation process. For example, an encapsulation substrate (not shown) including a transparent insulating material may be disposed above the second electrode 170, and the base substrate 100 including the display element DD disposed therein and the encapsulation substrate may be attached to above the second electrode 170 to manufacture the display device.

A transparent insulating layer (not shown) may be formed on the second electrode 170 to isolate the display element DD from an external environment, thus manufacturing the display device.

FIGS. 9 through 12 are cross-sectional views illustrating a method for manufacturing the TFT illustrated in FIG. 1.

Figure 9:
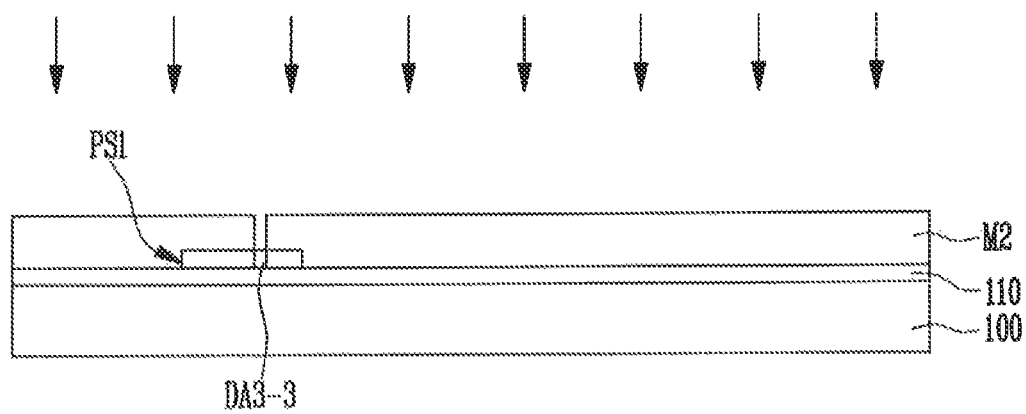
FIGS. 9 through 12 are cross-sectional views illustrating a method for manufacturing the TFT illustrated in FIG. 1.

Referring to FIG. 9, the first polycrystalline silicon layer PS1 may be formed on the base substrate 100 with the buffer layer 110 formed thereon. Thereafter, a second mask layer M2 exposing a portion of the first polycrystalline silicon layer PS1 may be formed. Herein, the second mask layer M2 may be formed. The second mask layer M2 may include a photoresist material.

After the second mask layer M2 is formed, a third doping process may be performed to dope impurity, for example, a P-type impurity in the exposed region of the first polycrystalline silicon layer PS1. The doped region of the first polycrystalline silicon layer PS1 may be the third region DA3-3 doped with an impurity having a third doping concentration.

Figure 10:
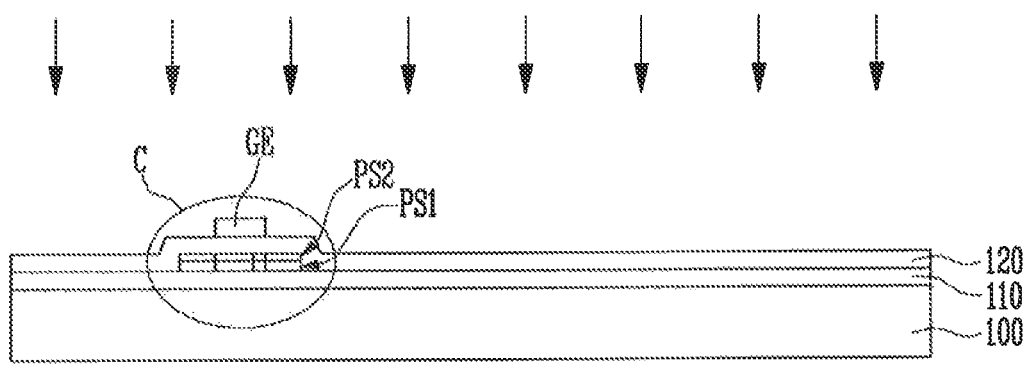

Referring to FIG. 10, after the third doping process is performed, the second polycrystalline silicon layer PS2 may be formed on the first polycrystalline silicon layer PS1 to form the semiconductor active layer SA including the first polycrystalline silicon layer PS1 and the second polycrystalline silicon layer PS2. A thickness of the first polycrystalline silicon layer PS1 may be equal to or more than 0.5 times to less than 1 time as thick as the semiconductor active layer SA.

After the semiconductor active layer SA is formed, the gate insulating layer 120 covering the buffer layer 110 and the semiconductor active layer SA may be formed, and the gate electrode GE may be formed on the gate insulating layer 120. The gate electrode GE may overlap with the third region DA3-3.

After the gate electrode GE is formed, a fourth doping process may be performed with a P-type impurity by using the gate electrode GE as a mask. The fourth doping process may be performed such that the P-type impurity is doped up to the first polycrystalline silicon layer PS1.

Figure 11:
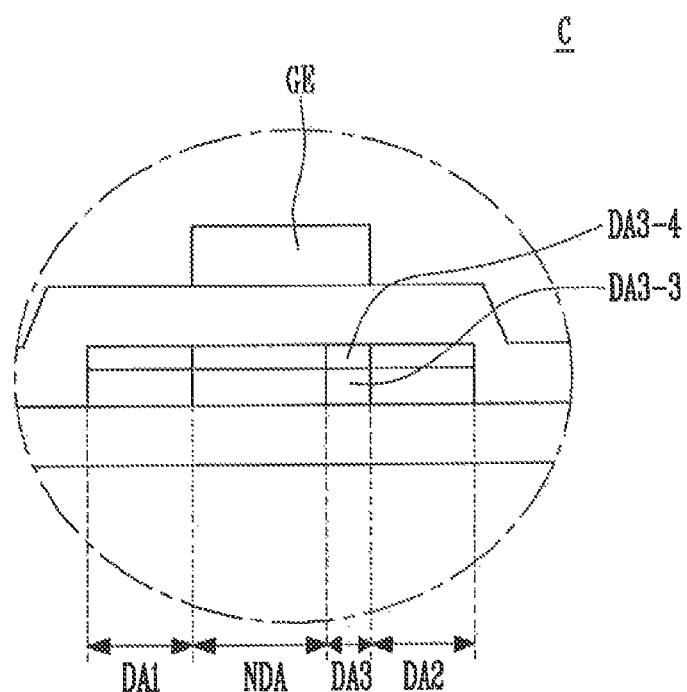

As illustrated in FIG. 11, by the fourth doping process, opposite ends of the semiconductor active layer SA may be the first and second doped regions DA1 and DA2 doped with an impurity having a fourth doping concentration. The first and second doped regions DA1 and DA2 may be a source region and a drain region of the TFT, respectively. The third doping concentration may be one to five times as concentrated as the fourth doping concentration.

In the semiconductor active layer SA, the third region DA3-3 and a fourth region DA3-4 of the second polycrystalline silicon layer PS2 corresponding to the third region DA3-3 may be the third doped region DA3. When the third region DA3-3 is not doped with an impurity in the second doping process, it may have a doping concentration different from that of the first and second doped regions DA1 and DA2.

A region between the first and third doped regions DA1 and DA3 may be a channel region of the TFT.

Figure 12:
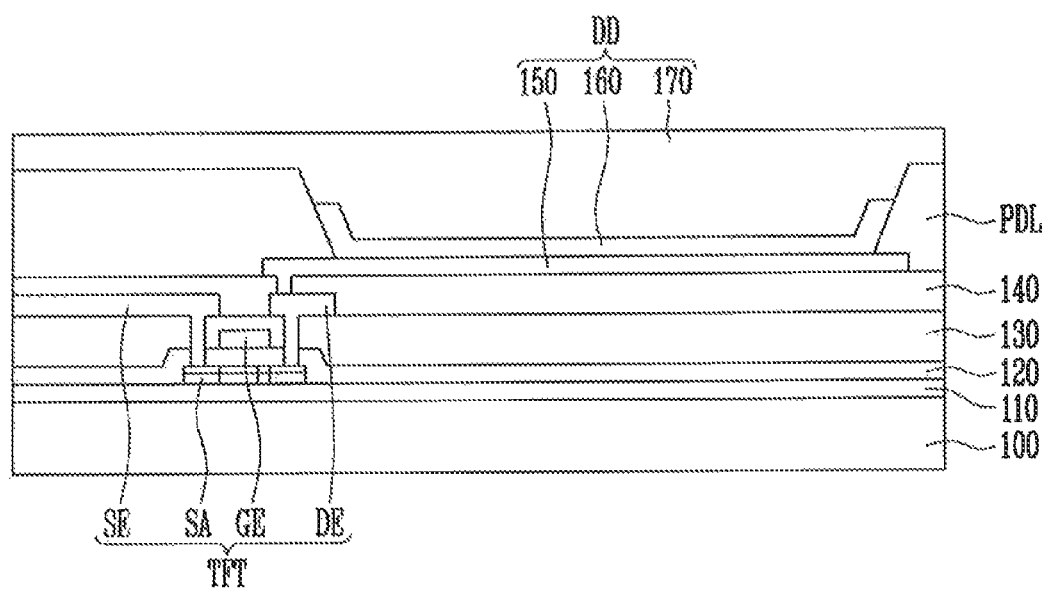

Referring to FIG. 12, after the second doping process is performed, the interlayer insulating layer 130 covering the gate electrode GE and having contact holes exposing the first and second doped regions DA1 and DA2 may be formed.

After the interlayer insulating layer 130 is formed, the source electrode and the drain electrode DE connected to the first and second doped regions DA1 and DA2, respectively, may be formed to manufacture the TFT.

After the TFT is manufactured, the protective layer 140 covering the TFT and having a via hole exposing a portion of the drain electrode DE may be formed.

After the protective layer 140 is formed, the display element DD including the first electrode 150 disposed on the protective layer 140 and connected to the drain electrode DE, the organic layer 160 disposed on the first electrode 150, and the second electrode 170 disposed on the organic layer 160 may be formed.

When the TFT, as described above, has the doped regions adjacent to the drain region and overlapping with the gate electrode GE, leakage of an OFF current may be prevented. Thus, an abnormal operation of the TFT may be prevented, increasing driving stability of the display device having the TFT.

While the invention has been particularly shown and described with reference to exemplary embodiments thereof, it will be understood by those of ordinary skill in the art that various changes in form and detail may be made therein without departing from the spirit and scope of the present invention.

What is claimed is:

1. A thin film transistor (TFT), comprising:
    a semiconductor active layer including a first doped region as a source region, a second doped region as a drain region, an undoped region disposed between the first and second doped regions, and a third doped region disposed between the second doped region and the undoped region, wherein the third doped region comprises a first portion doped with an impurity and a second portion disposed on the first region, wherein the second portion is undoped;
    a gate electrode, wherein the gate electrode is insulated from the semiconductor active layer and overlaps the third doped region and the undoped region;
    a source electrode connected to the first doped region; and
    a drain electrode connected to the second doped region.

2. The TFT of claim 1, wherein the semiconductor active layer further comprises:
    a first polycrystalline silicon layer; and
    a second polycrystalline silicon layer disposed on the first polycrystalline silicon layer.

3. The TFT of claim 2, wherein the first portion is disposed in the first polycrystalline silicon layer and the second portion is disposed in the second polycrystalline silicon layer.

4. The TFT of claim 3, wherein a thickness of the first polycrystalline silicon layer is greater than or equal to 0.5 times a thickness of the semiconductor active layer and less than or equal to 1 time the thickness of the semiconductor active layer.

5. The TFT of claim 1, wherein a doping concentration of the third region is greater than or equal to 0.5 times a doping concentration of the first and second doped regions and is less than or equal to 5 times a doping concentration of the first and second doped regions.

6. A method of manufacturing a thin film transistor (TFT), the method comprising:
    forming a first polycrystalline silicon layer on a base substrate;
    performing a first doping process to form first and second impurity regions in opposite ends of the first polycrystalline silicon layer;
    forming a second polycrystalline silicon layer on the first polycrystalline silicon layer to form a semiconductor active layer including the first and second polycrystalline silicon layers;
    forming a gate electrode overlapping with a region between the first and second impurity regions, and partially overlapping the first or second impurity regions, wherein the gate electrode is insulated from the semiconductor active layer;
    performing a second doping process using the gate electrode as a mask and thereby forming first and second doped regions in opposite ends of the semiconductor active layer not overlapping with the gate electrode, an undoped region between the first and second doped region, and a third doped region between the second doped region and the undoped region; and
    forming a source electrode and a drain electrode connected to the first doped region and the second doped region.

7. The method of manufacturing a TFT of claim 6, wherein the third doped region comprises:
    a first portion of the first polycrystalline silicon layer, which does not overlap with the gate electrode; and
    a second portion disposed on the first region, wherein the second portion is undoped.

8. The method of manufacturing a TFT of claim 6, wherein a doping concentration of the first region is greater than or equal to 0.5 times a doping concentration of the first and second doped regions and less than or equal to 1 time a doping concentration of the first and second doped regions.

9. The method of manufacturing a TFT of claim 6, wherein a thickness of the first polycrystalline silicon layer is greater than or equal to 0.5 times a thickness of the semiconductor active layer and less than or equal to 1 time a thickness of the semiconductor active layer.

10. A method of manufacturing a thin film transistor (TFT), the method comprising:
    forming a first polycrystalline silicon layer on a base substrate;
    performing a first doping process and thereby forming an impurity region in the first polycrystalline silicon layer;
    forming a second polycrystalline silicon layer on the first polycrystalline silicon layer and thereby forming a semiconductor active layer including the first and second polycrystalline silicon layers;
    forming a gate electrode overlapping the semiconductor active layer including a portion of the impurity region, wherein the gate electrode is insulated from the semiconductor active layer;
    performing a second doping process using the gate electrode as a mask and thereby forming first and second doped regions in opposite ends of the semiconductor active layer not overlapping with the gate electrode, an undoped region between the first and second doped region, and a third doped region disposed between the second doped region and the undoped region and including the impurity region; and
    forming a source electrode and a drain electrode connected to the first doped region and the second doped region.

11. The method of manufacturing a TFT of claim 10, wherein the third doped region comprises:
    a first portion including the impurity region of the first polycrystalline silicon layer; and
    a second portion which is disposed on the first portion, wherein the second portion is undoped.

12. The method of manufacturing a TFT of claim 11, wherein a doping concentration of the first region is greater than or equal to 1 time a doping concentration of the first and second doped regions and less than or equal to 5 times a doping concentration of the first and second doped regions.

13. The method of manufacturing a TFT of claim 10, wherein a thickness of the first polycrystalline silicon layer is greater than or equal to 0.5 times a thickness of the semiconductor active layer and less than or equal to 1 time a thickness of the semiconductor active layer.

14. A thin film transistor (TFT), comprising:
    a base substrate;
    a semiconductor active layer disposed on the base substrate and comprising a first doped region disposed at a first end of the semiconductor active layer, a second doped region disposed at an opposite end of the semiconductor active layer, a third doped region disposed between the first and second doped regions, and an undoped region disposed between the first and second doped regions;
    a source electrode disposed on the first doped region;
    a drain electrode disposed on the second doped region; and
    a gate electrode disposed between the source electrode and the drain electrode, wherein the gate electrode overlaps at least a portion of the third doped region,
    wherein the third doped region comprises a first portion doped with an impurity and a second portion disposed on the first portion.

15. The TFT of claim 14, wherein the semiconductor active layer further comprises:
    a first polycrystalline silicon layer; and
    a second polycrystalline silicon layer disposed on the first polycrystalline silicon layer.

16. The TFT of claim 14, wherein the gate electrode is insulated from the semiconductor active layer.

17. The TFT of claim 14, further comprising a protective layer disposed on the source electrode and the drain electrode.

18. The TFT of claim 14, further comprising a buffer layer disposed between the base substrate and the semiconductor active layer.

* * * * *